United States Patent
Hsu

(10) Patent No.: US 8,120,011 B2
(45) Date of Patent: Feb. 21, 2012

(54) OPTO-ELECTRONIC DEVICE

(75) Inventor: Ta-Cheng Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 116 days.

(21) Appl. No.: 12/570,255

(22) Filed: Sep. 30, 2009

(65) Prior Publication Data
US 2010/0078625 A1 Apr. 1, 2010

(30) Foreign Application Priority Data

Oct. 1, 2008 (TW) .................... 97137880 A

(51) Int. Cl.
*H01L 29/06* (2006.01)
*H01L 31/072* (2006.01)
*H01L 31/109* (2006.01)
*H01L 31/0328* (2006.01)
*H01L 31/0336* (2006.01)

(52) U.S. Cl. ................... 257/13; 257/90; 977/949
(58) Field of Classification Search .......... 257/13, 257/90, E33.008; 977/949
See application file for complete search history.

(56) References Cited

U.S. PATENT DOCUMENTS

| 7,763,881 B2 * | 7/2010 | Lee et al. ............... 257/13 |
| 2008/0087909 A1 * | 4/2008 | Weisbuch et al. ............... 257/98 |
| 2008/0185595 A1 * | 8/2008 | Moon et al. ............... 257/79 |
| 2009/0153024 A1 * | 6/2009 | Liu et al. ............... 313/503 |

FOREIGN PATENT DOCUMENTS

CN 1697208 A 11/2005
* cited by examiner

*Primary Examiner* — Phuc Dang
(74) *Attorney, Agent, or Firm* — Muncy, Geissler, Olds & Lowe, PLLC

(57) ABSTRACT

The present application relates to an opto-electronic device. The opto-electronic device includes a first light-emitting structure and a second light-emitting structure. The first light-emitting structure is capable of generating a first light having a first wavelength. The second light-emitting structure is capable of generating a second light having a second wavelength. The first light-emitting structure includes a nanorod structure having a first active layer, and the first active layer can absorb the second light to generate the first light.

20 Claims, 4 Drawing Sheets

OPTO-ELECTRONIC DEVICE

CROSS REFERENCE TO RELATED APPLICATIONS

This application claims the right of priority based on Taiwan Patent Application No. 097137880 entitled "Opto-electronic Device", filed on Oct. 1, 2008, which is incorporated herein by reference and assigned to the assignee herein.

TECHNICAL FIELD

The present application relates to an opto-electronic device, and more particularly to a light-emitting diode with a nanorod structure.

DESCRIPTION OF THE RELATED ART

Light-emitting diodes (LEDs) are small in volume, have long life-time, use a low driving voltage, have low power consumption, have a rapid response speed, and are shockproof. Therefore, the light-emitting diodes have been widely applied in various electric products, such as backlight modules and illumination devices.

In the solid-state lighting industry, the light-emitting diode is an important device. The light-emitting diode structure includes a p-type cladding layer, an n-type cladding layer and an active layer sandwiched between the p-type cladding layer and the n-type cladding layer. If a driving current is applied on contact electrodes of the p-type cladding layer and the n-type cladding layer, holes and electrons generated on the p-type cladding layer and the n-type cladding layer correspondingly would be injected into and recombined in the active layer to generate light. The light is omnidirectional which can be emitted out from every surface of the structure. Generally, the active layer can be a single quantum well structure (SQW) or a multiple quantum well structure (MQW). Comparing with the single quantum well structure, the multiple quantum well structure has a higher photoelectric transformation efficiency, and even if the current is low, the multiple quantum well structure may still convert the current into the light by many narrow band structures composed of alternately laminated well layers and barrier layers.

Nevertheless, the photoelectric transformation efficiency of the multiple quantum well structure may be easily affected by crystal quality and piezoelectric field. For example, in the light-emitting diode made of semiconductor like gallium nitride series, for obtaining the light with a relatively long wavelength, the content of indium in the quantum well should be increased which may reinforce the piezoelectric field effect, generate relatively many crystal defects and degrade the overall crystal quality. Consequently, the luminous efficiency of the light-emitting diode is decreased.

SUMMARY

In one embodiment of the present application, an opto-electronic device includes a first light-emitting structure and a second light-emitting structure. The first light-emitting structure is capable of generating a first wavelength light. The second light-emitting structure is capable of generating a second wavelength light. The first light-emitting structure includes a nanorod structure having a first active layer which can absorb the second wavelength light to generate the first wavelength light.

In one embodiment of the present application, the second light-emitting structure having a second active layer, and the band gap of the second active layer is greater than that of the first active layer.

In one embodiment of the present application, a nanorod structure includes a transparent insulation material and a plurality of nanorods. The first active layer is formed in the plurality of nanorods, and the transparent insulation material is filled up the space among the nanorods.

In one embodiment of the present application, an opto-electronic device includes a substrate, a first light-emitting structure formed on the substrate, and a second light-emitting structure formed on the first light-emitting structure. An opto-electronic device further includes a buffer layer located between a substrate and the first light-emitting structure.

In one embodiment of the present application, a second light-emitting structure comprises a first cladding layer, a second cladding layer and a second active layer. The first cladding layer connected to the first light-emitting structure, and the second active layer located between the first cladding layer and the second cladding layer. A band gap of the second active layer can be greater than that of the first active layer. Each of the first cladding layer, the second cladding layer, the first active layer, and the second active layer is made of semiconductor like gallium nitride series.

In the abovementioned opto-electronic device, the first light-emitting structure has a nanorod structure having a first active layer that can emit a different light by absorbing the light emitted from the second light-emitting structure. Because of the characteristics of the nanorod structure, the first active layer has higher luminescence efficiency so it can easily enhance the luminescence efficiency of the opto-electronic device.

A backlight module includes a light source containing an opto-electronic device as described in the abovementioned embodiments, an optical device disposed at a light emitting path of the light source, and a power supply system providing electric energy to the light source.

An illumination device includes a light source containing an opto-electronic device as described in the abovementioned embodiments, a power supply system providing electric energy to the light source, and a controlling unit controlling the power supply system.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
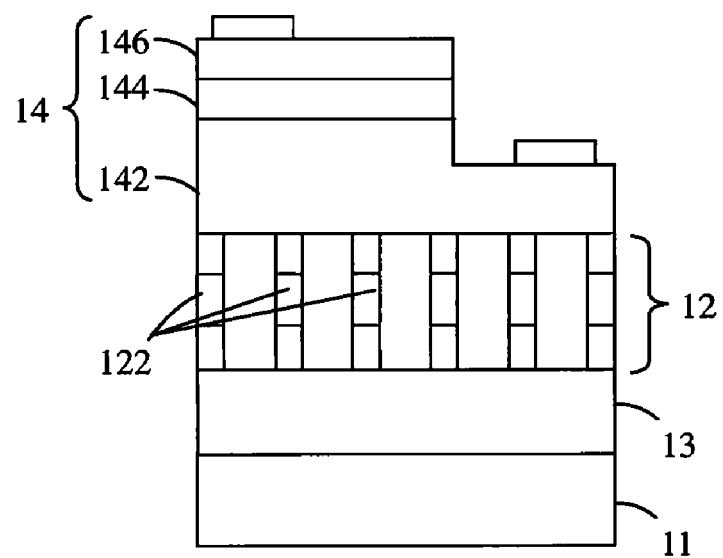
FIG. 1 is a schematic view of an opto-electronic device in accordance a first embodiment of the present application.

FIG. 1 is a schematic view of an opto-electronic device in accordance a first embodiment of the present application.

Referring to FIG. 1, the opto-electronic device 10 is a light-emitting diode, which includes a first light-emitting structure 12 and a second light-emitting structure 14. The first light-emitting structure 12 can emit a first light having a first wavelength. The second light-emitting structure 14 can emit a second light having a second wavelength. The first light-emitting structure 12 includes a nanorod structure having a first active layer 122 which can absorb the second light to generate the first light. Alternatively, the first light-emitting structure 12 can have a plurality of active layers. The active layers can be stimulated by the second light to emit lights with various wavelengths and then being mixed with each other. For example, the second light having a short wavelength to excite three active layers of the first light-emitting structure 12 to generate a red light, a green light and a blue light, and then the red light, the green light and the blue light are mixed together to become a white light.

In this embodiment, the opto-electronic device 10 further includes a substrate 11 and a buffer layer 13. The buffer layer 13, the first light-emitting structure 12 and the second light-emitting structure 14 are located in sequence on the substrate 11. The second light-emitting structure 14 includes an n-type cladding layer 142, a second active layer 144 and a p-type cladding layer 146. The n-type cladding layer 142 is connected to the first light-emitting structure 12. The second active layer 144 and the p-type cladding layer 146 are located in sequence on the n-type cladding layer 142. The second active layer 144 of the second light-emitting structure 14 can be a quantum well structure. The n-type cladding layer 142, the second active layer 144 and the p-type cladding layer 146 can be made of semiconductor like gallium nitride series. For example, a material of the n-type cladding layer 142 is n-type gallium nitride (GaN), a material of the p-type cladding layer 146 is p-type gallium nitride and the second active layer 144 is the quantum well of indium gallium nitride (InGaN).

The nanorod structure of the first light-emitting structure 12 includes a plurality of nanorods. Two ends of the nanorods connect with the buffer layer 13 and the n-type cladding layer 142 of the second light-emitting structure 14 respectively. To enhance the interfacial compatibility, the materials of the two ends of the nanorods can be similar to the material of the buffer layer 13 and the n-type cladding layer 142 correspondingly. In this embodiment, the materials of the two ends of the nanorods are gallium nitride. Each of the nanorods has an active portion in a middle portion thereof, and the active portion can be a quantum well of indium gallium nitride. The first active layer 122 is composed of the active portions of the nanorods. A band gap of the first active layer 122 can be smaller than that of the second active layer 144. In other words, a wavelength of the second light emitted from the second active layer 144 can be shorter than that of the first light emitted from the first active layer 122. For example, the second light is a blue light and the first light is a green light. In this embodiment, to make the wavelength of the second light be shorter than that of the first light, a concentration of indium in the second active layer 144 can be lower than that in the first active layer 122. In addition, a material of the substrate can be sapphire, gallium nitride, aluminium nitride, aluminium gallium nitride (AlGaN) or silicon carbide (SiC).

In the opto-electronic device 10, the first light-emitting structure 12 has the nanorod structure, and the first active layer 122 of the first light-emitting structure 12 can absorb the second light to generate the first light. The nanorod structure has some advantages such as stress relaxation and large area of sidewall surface; therefore, the piezoelectric field can be reduced, the defects can be decreased, and the light extraction efficiency of the first active layer 122 can be enhanced so that the luminous efficiency of the opto-electronic device 10 is improved as well. Furthermore, because the band gap of the first active layer 122 is smaller than that of the second active layer 144, in view of the high photoelectric transformation efficiency of the second active layer 144 and the excellent light extraction efficiency of the nanorod structure of the first active layer 122, the second light with the relatively short wavelength generated by the second active layer 144 is converted into the first light with relatively long wavelength by the first active layer 122 easily and efficiently. As a result, the luminous efficiency of light with relatively long wavelength of the opto-electronic device 10 can be further improved. In this embodiment, the concentration of indium in the second active layer 144 is relatively low so the influence of the piezoelectric field the second active layer 144 is reduced and/or avoided, and thus the second active layer 144 may emit the second light with relatively short wavelength efficiently. In the first active layer 122, the nanorod structure with photoluminescence is utilized to convert the second light with relatively short wavelength into the first light with a relatively long wavelength, therefore, even if the concentration of indium in the first active layer 144 is relatively high, the photoelectric transformation efficiency of the first active layer 122 would be high. Thus the luminous efficiency of light with relatively long wavelength of the opto-electronic device 10 can be improved.

A method for making the opto-electronic device 10 can include the following steps. Firstly, a first epitaxial layer is formed on the substrate 11 by performing a first epitaxial process. Taking the semiconductor of gallium nitride series for example, the epitaxial layer can be formed by depositing a first gallium nitride layer on the substrate 11, and depositing an indium gallium nitride layer to form a quantum well layer on the first gallium nitride layer, and then depositing a second gallium nitride layer on the quantum well layer. Secondly, the first epitaxial layer is etched down to the first gallium nitride layer along a direction perpendicular to the substrate 11 by performing a reactive ion etching process. A portion of the first gallium nitride layer that is not etched forms the buffer layer 13. The other portion of the first gallium nitride layer that is etched constitutes nanorods distributed randomly, and the nanorods form the nanorod structure as the first light-emitting structure 12. Finally, the second light-emitting structure 14 is formed on the first light-emitting structure 12 by performing a second epitaxial process, and the opto-electronic device 10 is formed. Another method for making the opto-electronic device 10 can include the following steps: Firstly, the buffer layer 13 is formed on the substrate 11 by deposition. Secondly, the nanorods are formed on the buffer layer 13 by oriented growth, and the nanorods form the nanorod structure as the first light-emitting structure 12. Finally, the second light-emitting structure 14 is formed on the first light-emitting structure 12 by an epitaxial process, and the opto-electronic device 10 is formed.

Figure 2:
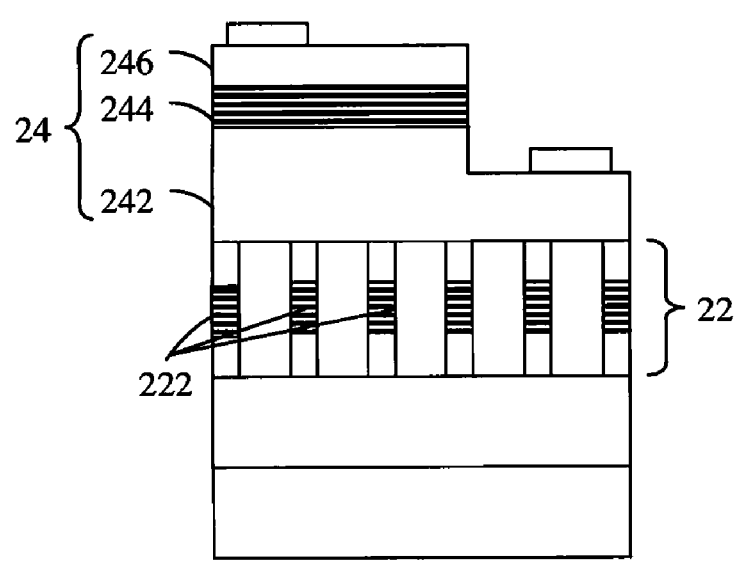
FIG. 2 is a schematic view of an opto-electronic device in accordance a second embodiment of the present application.

FIG. 2 is a schematic view of an opto-electronic device in accordance a second embodiment of the present application. Referring to FIG. 2, the opto-electronic device 20 is similar in principle to the opto-electronic device 10, and includes a first light-emitting structure 22 and a second light-emitting structure 24. The first light-emitting structure 22 includes a nanorod structure having a first active layer 222. The second light-emitting structure 24 includes an n-type cladding layer 242, a second active layer 244 and a p-type cladding layer 246. However, in the opto-electronic device 20, the first active layer 222 and the second active layer 244 are multiple quantum well structures. Because the multiple quantum well structure has the relatively high photoelectric transformation efficiency, the luminous efficiency of the opto-electronic device 20 can be further improved. In an alternative embodiment, in the opto-electronic device 20, one of the first active layer 222 and the second active layer 244 is multiple quantum well structure.

Figure 3:
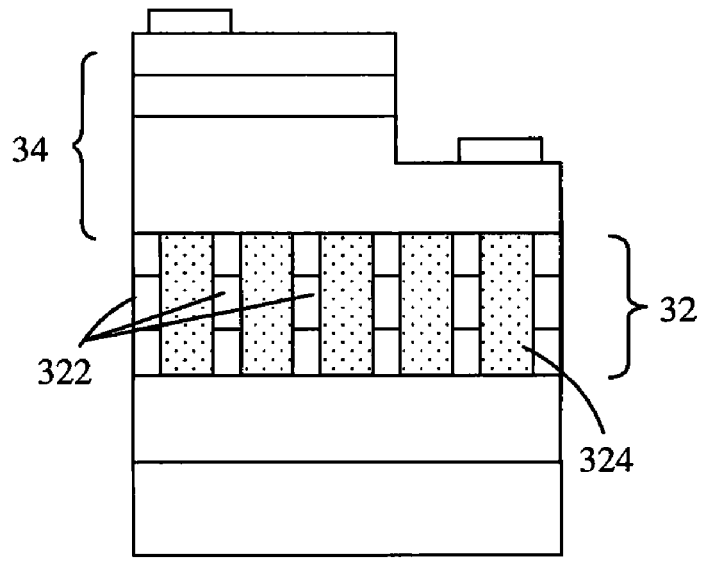
FIG. 3 is a schematic view of an opto-electronic device in accordance a third embodiment of the present application.

FIG. 3 is a schematic view of an opto-electronic device in accordance a third embodiment of the present application. Referring to FIG. 3, the opto-electronic device 30 is similar in principle to the opto-electronic device 10, and includes a first light-emitting structure 32 and a second light-emitting structure 34. The first light-emitting structure 32 includes a nanorod structure having a plurality of nanorods wherein each of the nanorods includes a first active layer 322. However, in the opto-electronic device 30, the first light-emitting structure 32 further includes a transparent insulation material 324 filled up the space among the nanorods. The transparent insulation material 324 may prevent the nanorods from being affected by the environment. A material of the transparent insulation material 324 can be spin-on glass, silicon dioxide, epoxy resin or other materials having fluorescent powder therein.

Figure 4:
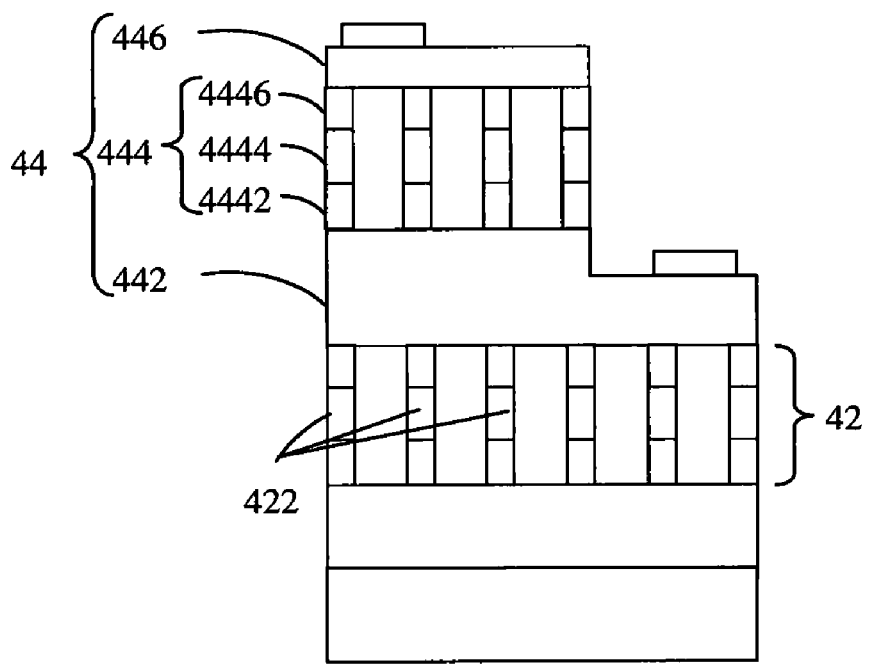
FIG. 4 is a schematic view of an opto-electronic device in accordance a fourth embodiment of the present application.

FIG. 4 is a schematic view of an opto-electronic device in accordance a fourth embodiment of the present application. Referring to FIG. 4, the opto-electronic device 40 is similar in principle to the opto-electronic device 10, and includes a first light-emitting structure 42 and a second light-emitting structure 44. The first light-emitting structure 42 includes a nanorod structure having a first active layer 422. The second light-emitting structure 44 includes an n-type cladding layer 442, a second active layer 444 and a p-type cladding layer 446. However, in the opto-electronic device 40, a second nanorod structure 444 is sandwiched between the n-type cladding layer 442 and the p-type cladding layer 446. The second nanorod structure 444 includes a first end 4442, an active portion 4444 and a second end 4446. The first end 4442 is connected to the n-type cladding layer 442. The second end 4446 is connected to the p-type cladding layer 446. The active portion 4444 is located between the first end 4442 and the second end 4446. All the active portions 4444 form the second active layer of the second light-emitting structure 44. Materials of the first end 4442 and the second end 4446 can be n-type semiconductor and p-type semiconductor respectively. The active portion 4444 can be a quantum well structure. Because the second light-emitting structure 44 is a nanorod structure, the luminous efficiency of the opto-electronic device 40 can be further improved.

Figure 5:
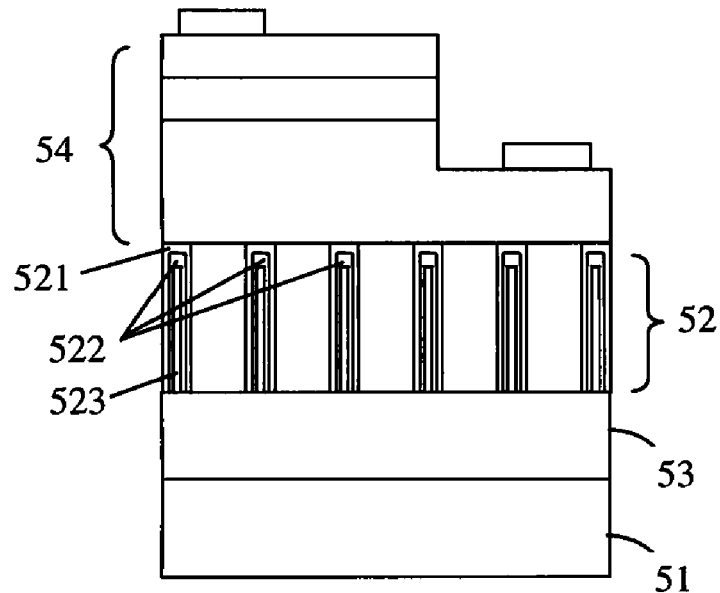
FIG. 5 is a schematic view of an opto-electronic device in accordance a fifth embodiment of the present application.

FIG. 5 is a schematic view of an opto-electronic device in accordance a fifth embodiment of the present application. Referring to FIG. 5, the opto-electronic device 50 is similar in principle to the opto-electronic device 10, and includes a second light-emitting structure 54, a first light-emitting structure 52, a buffer layer 53 and a substrate 51. The first light-emitting structure 52 includes a nanorod structure having a plurality of nanorods. Each nanorod includes an outer portion 521, an active portion 522 and central portion 523. The active portions 522 of the nanorods form the first active layer of the first light-emitting structure 52. Because the first active layer is formed on the sidewalls of the nanorods, the area of the first active layer is increased. The photoelectric transformation efficiency can be improved accordingly, and the light generated in the first active layer can emit out from the side surface easily. Furthermore, the side surface is crystalline plane with polarity or semi-polarity, and the piezoelectric field effect in the first active layer can be reduced, and thus the photoelectric transformation efficiency can be further improved.

In summary, in the opto-electronic device, the first light-emitting structure has the nanorod structure, and the first active layer of the first light-emitting structure can absorb the second light to generate the first light. The nanorod structure has some advantages which may enhance the photoelectric transformation efficiency of the first active layer. Therefore, the luminous efficiency of the opto-electronic device can be improved.

Figure 6:
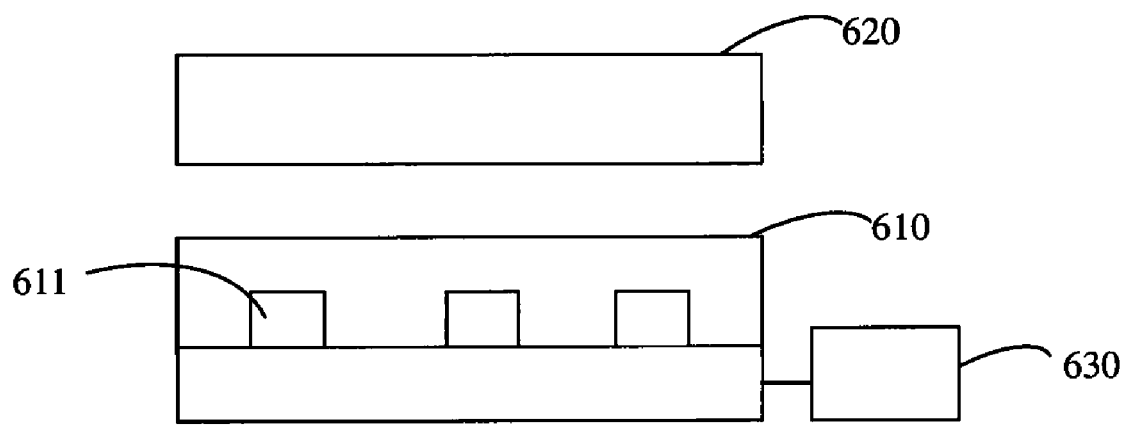
FIG. 6 is a schematic view of a backlight module in accordance an embodiment of the present application.

FIG. 6 is a schematic view of a backlight module in accordance an embodiment of the present application. Referring to FIG. 6, the backlight module 600 includes a light source 610, an optical device 620 and a power supply system 630. The light source 610 includes the opto-electronic devices 611 that can be selected from the opto-electronic devices as described in the abovementioned embodiments. The optical device 620 is disposed at a light emitting path of the light source 610. The power supply system 630 provides electric energy to the light source 610.

Figure 7:
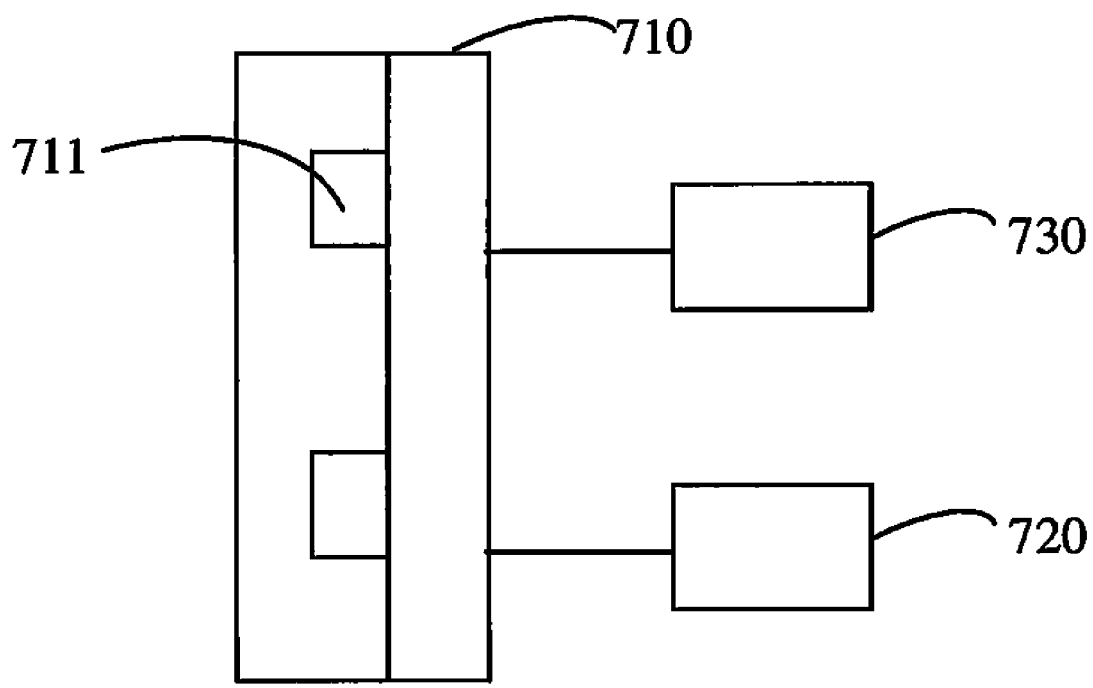
FIG. 7 is a schematic view of an illumination device in accordance an embodiment of the present application.

FIG. 7 is a schematic view of an illumination device in accordance an embodiment of the present application. Referring to FIG. 7, the illumination device 700 includes a light source 710, a power supply system 720 and a controlling unit 730. The illumination device 700 can be a car lamp, a street lamp, a flashlight or indicator lamp. The light source 710 includes the opto-electronic devices 711 that can be selected from the opto-electronic devices as described in the abovementioned embodiments. The power supply system 720 provides electric energy to the light source 710. The controlling unit 730 controls the power supply system 720 to provide electric energy to the light source 710.

It is noted that the scope of the present opto-electronic device, backlight module and illumination device using the opto-electronic device is not limited to the embodiments described abovementioned. For example, in the opto-electronic device 10, the location of the n-type cladding layer 142 and the p-type cladding layer 146 can be exchanged, and one of the buffer layer 13 and the substrate 11 can be omitted if the material of another one is properly changed.

The above description is given by way of example, and not limitation. Given the above disclosure, one having ordinary skill in the art could devise variations that are within the scope and spirit of the application disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An opto-electronic device, comprising:
a first light-emitting structure comprising indium, capable of generating a first light having a first wavelength; and
a second light-emitting structure comprising indium, capable of generating a second light having a second wavelength;
wherein the first light-emitting structure includes a first nanorod structure having a first active layer that can absorb the second light to generate the first light; and
wherein the indium concentration in the first light-emitting structure is greater than that in the second light-emitting structure.

2. The opto-electronic device claimed in claim 1, wherein the second light-emitting structure has a second active layer, and a band gap of the second active layer is greater than that of the first active layer.

3. The opto-electronic device claimed in claim 1, wherein the second light-emitting structure includes a second nanorod structure.

4. The opto-electronic device claimed in claim 2, wherein at least one of the first active layer and the second active layer is a multiple quantum well structure.

5. The opto-electronic device claimed in claim 1, wherein the nanorod structure comprises a plurality of nanorods having the first active layer formed therein and a transparent insulation material filled up to space among the nanorods.

6. The opto-electronic device claimed in claim 1, further comprising a substrate; wherein the first light-emitting structure is located on the substrate and the second light-emitting structure is located on the first light-emitting structure.

7. The opto-electronic device claimed in claim 1, wherein the first wavelength is greater than the second wavelength.

8. The opto-electronic device claimed in claim 1, wherein the nanorod structure comprises a plurality of nanorods, wherein each of the nanorods has an active portion in a middle portion thereof, and the active portions of the nanorods form the first active layer.

9. The opto-electronic device claimed in claim 1, wherein the nanorod structure comprises a plurality of nanorods, each of the nanorods having an active portion on a sidewall thereof, and the active portions of the nanorods form the first active layer.

10. The opto-electronic device claimed in claim 1, wherein the second light-emitting structure comprises a first cladding layer, a second cladding layer and a second active layer, the first cladding layer connected to the first light-emitting structure, and the second active layer located between the first cladding layer and the second cladding layer.

11. The opto-electronic device claimed in claim 10, wherein a band gap of the second active layer is greater than that of the first active layer.

12. The opto-electronic device claimed in claim 11, wherein at least one of the first cladding layer, the second cladding layer, the first active layer, and the second active layer is made of semiconductor like gallium nitride series.

13. The opto-electronic device claimed in claim 12, wherein the first active layer and the second active layer comprise indium, and the concentration of indium in the first active layer is greater than that in the second active layer.

14. The opto-electronic device claimed in claim 13, wherein the first active layer or the second active layer is a multiple quantum well structure.

15. The opto-electronic device claimed in claim 10, wherein the nanorod structure comprises a plurality of nanorods having the first active layer formed therein and a transparent insulation material filled up to space among the nanorods.

16. The opto-electronic device claimed in claim 10, wherein the second light-emitting structure comprises a second nanorod structure, and the second active layer is formed in the second nanorod structure.

17. The opto-electronic device claimed in claim 10, wherein the nanorod structure comprises a plurality of nanorods, wherein each of the nanorods has an active portion in a middle portion thereof, and the active portions of the nanorods form the first active layer.

18. The opto-electronic device claimed in claim 10, wherein the nanorod structure comprises a plurality of nanorods, each of the nanorods having an active portion on a sidewall thereof, and the active portions of the nanorods form the first active layer.

19. The opto-electronic device claimed in claim 1, wherein the first light-emitting structure further comprises one or more active layers.

20. The opto-electronic device claimed in claim 1, wherein the first light-emitting structure is capable of generating lights with different wavelengths.

* * * * *